United States Patent [19]

Hunt et al.

[11] 4,121,135

[45] Oct. 17, 1978

[54] APPARATUS FOR INTERFACING WITH PLASMA TYPE DISPLAY PANELS

[75] Inventors: Raymond L. Hunt; Ben H. Lin; Thomas A. Ream; Gene D. Robertson; John H. Young, all of Fort Wayne, Ind.

[73] Assignee: The Magnavox Company, Fort Wayne, Ind.

[21] Appl. No.: 745,335

[22] Filed: Dec. 20, 1976

[51] Int. Cl.² .................... H05B 37/00; H05B 41/00
[52] U.S. Cl. ...................... 315/169 R; 315/169 TV; 340/324 M
[58] Field of Search ............. 315/169 TV, 169 R, 51, 315/58; 339/17 M, 17 LM, 59 M; 340/324 M

[56] References Cited

U.S. PATENT DOCUMENTS

| | | | |
|---|---|---|---|
| 2,955,231 | 10/1960 | Aiken | 315/169 TV |
| 3,327,154 | 6/1967 | Bowerman | 315/169 TV |
| 3,347,614 | 10/1967 | Fuller et al. | 315/169 TV |
| 3,631,287 | 12/1971 | Hoehn | 315/169 R |
| 3,638,163 | 1/1972 | Loosme | 339/17 M |
| 3,668,688 | 6/1972 | Schmersal | 315/169 TV |
| 3,684,918 | 8/1972 | Schmersal | 315/169 TV |

Primary Examiner—Nelson Moskowitz
Assistant Examiner—Lawrence Goodwin
Attorney, Agent, or Firm—Thomas A. Briody; Frank R. Trifari; William J. Iseman

[57] ABSTRACT

In a plasma type display panel of the type having a plurality of parallel row and parallel column electrical conductors forming an array of matrix cross points for providing discrete discharge and light emitting sites upon selection and addressing one or more said sites by selection and addressing circuit means electrically connected to the panel conductors, an improved method and apparatus for providing all or part of the selection and addressing circuit means in one or more high density thick film circuit modules adapted to be detachably engaged with the panel and having conductors thereon in superposed relationship with the parallel panel conductors. The improvement further comprising a plurality of electrically conductive and compressible elastomeric pads interposed between the panel conductors and the module conductors for providing electrical interconnections of the panel conductors and the circuit modules when the circuit modules engage the panel and for providing a simultaneous disconnection of said interconnections when the modules are disengaged from the panel. In one embodiment of the invention a mounting means is provided for detachably receiving both the display panel and the circuit modules while in another embodiment the circuit modules are detachably affixed on the display panel itself. The invention greatly reduces the number of wire leads normally required for making electrical connections to the panel and in addition allows the circuit modules to be easily and rapidly removed and replaced without the use of any conductor bonding or precision alignment devices.

13 Claims, 15 Drawing Figures

APPARATUS FOR INTERFACING WITH PLASMA TYPE DISPLAY PANELS

BACKGROUND OF THE INVENTION

1. Field of the Invention

The present invention relates to plasma or gaseous discharge display panels and more particularly to detachable circuit modules integral therewith.

2. Description of the Prior Art

Plasma or gaseous discharge display panels such as disclosed, for example, in U.S. Pat. No. 3,499,167 to Baker, et al are well known in the art. Such display panels generally comprise a pair of glass plates mounted in spaced apart relationship forming a sealed chamber, within which is confined a single discharge gas or a mixture of such gases. Each one of the glass plates of the pair comprises on one surface thereof, a pattern of electrodes consisting of separate linear electrical conductors positioned side by side in a parallel relationship to one another. The parallel electrode pattern of one plate is generally, transversely positioned at a 90° angle in relationship to the parallel electrode pattern of the second plate with the electrode surfaces of both plates of the pair facing the internally formed gas chamber. The so combined pair of plates and their associated electrodes forming a grid like array of spaced apart columns and rows of individual electrodes having a plurality of discrete intersecting or cross-point discharge sites.

In the use of such type panels for the display of visual information, selected ones of the cross-point sites are supplied operating discharge and sustaining signals for providing visual light emission at the selected sites. Numerous methods and circuitry for so selecting and addressing the discharge sites have been used in the past and are well known in the art, an example of which is disclosed in U.S. Pat. No. 3,727,102 to Johnson.

It is obvious that a high resolution display panel requires a considerable number of discharge sites and minute spacing between the parallel electrode conductors. One such panel manufactured by Owen-Illinois and identified as Digivue ® Model 512-60, has a resolution of 60 lines or electrodes per inch with a total of 512 individual parallel column electrodes and 512 individual parallel row electrodes. Each alternate electrode of the 512 column electrodes and of the 512 row electrodes extend or exit on opposite ends of their respective glass plates. This provides a reduction of the number of electrode connections per side of the panel and thereby increases the physical spacing therebetween. In this particular example, each one of the four panel sides has 256 conductors to which electrical connections are made between the respective row and column electrodes and the associated selection and addressing circuitry. Typically, each one of these electrical conductors have a width of 0.012 inch and have a spacing, measured from the center of one conductor to the center of the adjacent parallel conductor, of 0.033 inch. In this exemplified display panel there are therefore a total of 1024 relatively narrow and closely spaced electrode conductors to which electrical connections must be made.

In the past, flat and flexible, multiple conductor cables have been used for interconnecting the 1024 panel electrodes with the associated display panel circuitry. The panel ends of the cable conductors are bonded to the display panel conductors by using thermocompression or reflow soldering techniques. Because the conductors on the display panel are generally deposited upon the glass substrate, the bonding operation must be closely controlled to prevent injury to the panel conductors. Both temperature and pressure must be controlled to prevent injury not only to the panel conductors but also to the panel glass substrate as well as to the interconnecting cable and its conductors. The display panel and attached cable assembly result in a somewhat unwieldy package requiring care in handling to prevent injury to the panel, cable, and the bonded connections. An example of this type of prior art is disclosed in U.S. Pat. No. 3,749,959 issued to Schmersal, et al.

The inherent large number of closely spaced and relatively narrow conductors of such display panels require precise control of mechanical alignment of the panel conductors to the respective mating cable conductors prior to and during any conductor bonding operation. This problem exists regardless of whether the bonding is made to the respective conductors of interconnecting cables as described above or to respective conductors of integral circuit modules as herein later described. In addition, irregularities in the glass substrate surface of the display panel or irregularities in the panel electrode conductors themselves, result in un-uniform and uneven pressures to be applied between the panel conductors and the mating interconnecting conductors during the bonding operation, especially when a plurality of such connections are bonded simultaneously. These irregularities also create a problem when nonbonded type connections are made to the display panel such as would be the case with the use of simple type electrical connections which depend solely upon friction and/or pressure for electrical continuity. The build-up of mechanical tolerances in both the panel conductors and the respective mating interconnecting conductors or contacts complicate the problem of making reliable electrical interconnections to the display panel.

In order to reduce the number of discrete interconnecting wire leads to the display panel, the prior art proposes integrally combining the display panel with certain of the selection and addressing circuitry. The combined circuitry is interconnected with the display panel conductors using either conventional solder bonding techniques or simple pressure type contacts as herein previously described. Such prior art is disclosed, for example, in U.S. Pat. Nos. 3,668,688 and 3,684,918 issued to Schmersal.

Although the latter described prior art reduces the number of discrete wire leads to the display panel, and tends to improve the circuit density and packaging of the combined panel and associated circuitry, the problem of the bonding of the electrical interconnections between the display panel electrode conductors and the selection and addressing circuitry still remains. In addition, since certain of the associated circuitry is substantially an integral and permanent part of the display panel, it cannot be easily removed or replaced without possible injury to the display panel or the interconnections between the panel and integral circuitry since the bonded connections must be unbonded and again rebonded for removal and replacement of the circuitry. In addition, repair or replacement of the circuitry integral with the panel cannot be made without the use of special contact bonding and alignment tools. This is, of course, a distinct disadvantage. It is desirable that such integral circuitry be easily and rapidly repaired and replaced both during manufacturing and field maintenance of the display panel and its integral circuitry. The use of circuitry which is an integral part of the display panel and which is not easily removed from the panel also hinders the inclusion of future circuit improvements in already manufactured and existing panels.

SUMMARY OF THE INVENTION

In view of the foregoing, it is an object of the present invention to provide an improved plasma display device having easily removable circuit modules integral therewith.

It is another object of the present invention to provide a plasma display device and associated circuit modules removably mounted thereon and having electrical interconnections therebetween which do not require bonding and which disengage automatically upon removal of the modules from said display device.

It is still another object of the present invention to provide a plasma display device comprising a plasma display panel and a plurality of circuit modules electrically interconnected and detachably juxtaposed with said panel, the circuit modules being readily attached and detached from said device without the necessity of precision positioning of the modules on said device or the bonding of the electrical interconnections therebetween.

It is another object of the present invention to provide high density circuit modules for detachably mounting to plasma display device and having highly reliable, non-bonded electrical interconnections thereto.

It is yet another object of the present invention to provide improved electrical interconnections between electrical conductors of a plasma display panel and conductors of thick film like circuit modules juxtaposed with the panel, the improved interconnections comprising an electrically conductive elastomeric material disposed between the panel conductors and said module conductors.

It is still another object of the present invention to provide mechanical pressure type electrical interconnections having improved electrical continuity between a plurality of rigid electrical conductors of a plasma display panel and like type conductors of a circuit module adapted to be demountably attached to said display panel.

It is a further object of the invention to provide a mounting apparatus for receiving a conventional plasma display panel without modification thereto and for demountably receiving a plurality of circuit modules having circuitry associated with the operation of the panel, the mounting apparatus adapted to provide electrical interconnections between the panel and the plurality of circuit modules upon the reception of said circuit modules.

These and other objects of the immediate invention will be apparent from the following description and accompanying figures.

In accordance with one embodiment of the invention, conventional and well known resistor-diode matrix decoding circuitry for a display panel of the aforementioned type is included in several thick film circuit modules. The signal output portions of the decoding circuitry supplying input signals to the display panel electrodes are terminated on the modules in the form of individual parallel linear conductors deposited upon one surface of the decoder circuit substrate. The so described output conductors are positioned on the substrate having substantially the same center to center spacing and width as the respective and corresponding electrode conductors of the display panel to which the individual decoder output signals are supplied. Circuitry portions for receiving input signals to the decoders as well as circuit portions requiring interconnection to like decoder circuit modules of the plurality are also terminated on the module substrate surface in the form of linear conductors deposited along one edge of the substrate surface.

A mounting device is provided for receiving and securing the display panel and the plurality of decoder circuit modules. The mounting device comprises printed circuit type conductors around the periphery of the secured panel for providing necessary electrical connection terminals for mating with the received circuit modules and for providing electrical interconnections between common circuit portions of the circuit modules. The printed circuit conductors also provide electrical interconnections between the circuit modules and conventional electrical connectors affixed to the mounting device for supplying input signals to the integrally combined decoder circuit modules and display panel from circuitry external to the combination.

The plurality of circuit modules are removably clamped around the outer periphery of the secured display panel overlaying portions of the printed circuit conductors and the display panel for providing mating of the terminal conductors on the circuit modules with the respective and corresponding terminal conductors on the printed circuitry and display panel. To ensure positive contact pressure and reliable electrical continuity between the aforementioned mating terminal conductors, a plurality of relatively small electrically conductive elastomeric pads are minutely spaced along major axes of the contact areas of the mating electrical conductors associated with each one of the circuit modules. The electrically conductive elastomeric pads are positioned between the mating contact areas and contacts and are compressed therebetween upon receivably clamping the circuit modules in place upon the module and display panel mouting device.

In another embodiment of the invention, the aforementioned display panel and circuit module mounting device is eliminated and the circuit modules are clampably received upon the display panel itself.

DETAILED DESCRIPTION OF THE PREFERRED EMBODIMENTS

Figure 1:
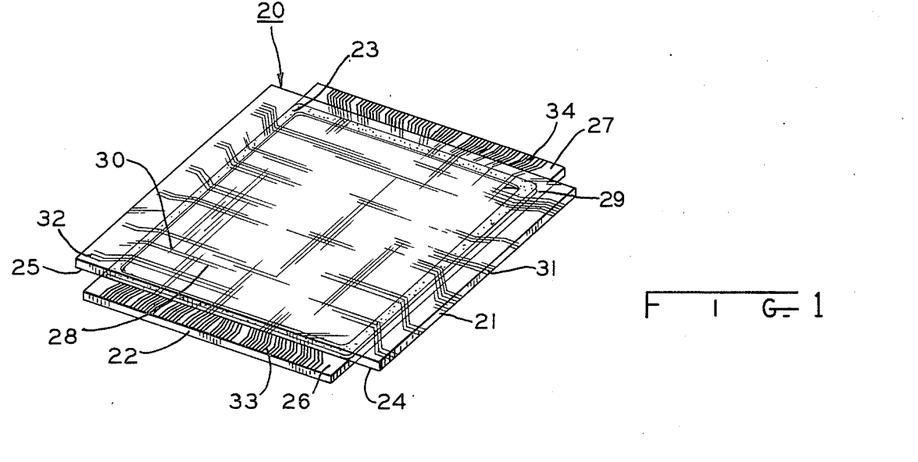
FIG. 1 is a perspective view of a typical plasma display panel to which the present invention relates.

Referring first to FIG. 1, there is shown a typical plasma or gaseous discharge display panel 20 of the type previously referenced and to which the present invention relates. Because such display panels as well as the various associated address and selection circuitry necessary for their operation are well known in the art, as exemplified by the previously referenced U.S. patents, further detailed description is not included herein other than the following.

Typically, the display panel 20 comprises a pair of flat, elongated, and rectangular glass plates 21, 22 overlaying one another and having common portions joined together in a spaced apart relationship by an attaching gasket 23 positioned between opposing and facing surfaces of the plates 21, 22. The attached plates 21, 22 and gasket 23 form a sealed chamber, within which is confined a gaseous discharge medium. Each one of the glass plates 21, 22 having a major axis running the length of the long dimension of the elongated plate and the two plates being positioned so that their respective major axes are at 90 degrees with respect to each other. Each one of the glass plates 21, 22 having respective end portions 24, 25 and 26, 27 extending beyond the attaching gasket 23 and overhanging the common attached portions of the two plates. The opposing and facing surfaces of each one of the two plates 21, 22 having deposited thereon respective electrode arrays 28, 29. Each one of the electrode arrays 28, 29 comprising a plurality of individual, closely spaced electrically conductive electrodes running parallel to each other and to the major axis of the respective plate and each one of the conductors or electrodes of each one of the arrays 28, 29 having a dielectric film (not shown) over the conductors separating the arrays 28, 29 from the gaseous medium within the sealed chamber. The electrode array pattern formed by the combined attached plates 21, 22 of the display panel 20 being a resultant array matrix comprising a plurality of intersecting cross points or discharge sites 30. Each one of the individual electrodes or conductors of each one of the electrode arrays 28, 29 extend and terminate on the respective end extensions 24, 25 and 26, 27 of the respective glass plates 21, 22 in the form of uninsulated terminal conductors for electrically interfacing with the necessary addressing and selection circuitry.

An electrode array such as 28 or 29 is commonly referred to as either a column or a row array depending upon the orientation of the array in the visual display equipment in which the panel 20 is utilized. Normally, but not necessarily, a column array is considered to be one in which the electrode conductors are vertically oriented in relation to the visual information displayed on the panel. Obviously then, the electrode conductors of a row array would be oriented horizontally.

In order to increase the physical spacing between the later mentioned uninsulated electrode terminal connection conductors, alternate electrodes of each individual electrode array terminate at opposite end extensions of the glass plate associated with the array. Thus in FIG. 1, electrode connection conductors 31 located on extension 24 of the plate 21 connect to the alternate half of the electrodes of array 28 while electrode connection conductors 32 on extension 25 connect to the remaining alternate electrodes of array 28. Likewise, electrode connection conductors 33 located on extension 26 of plate 22 connect to one half of the electrodes of array 29 while electrode connection conductors 34 on extension 27 connect to the remaining individual electrodes of array 29.

Figure 2:
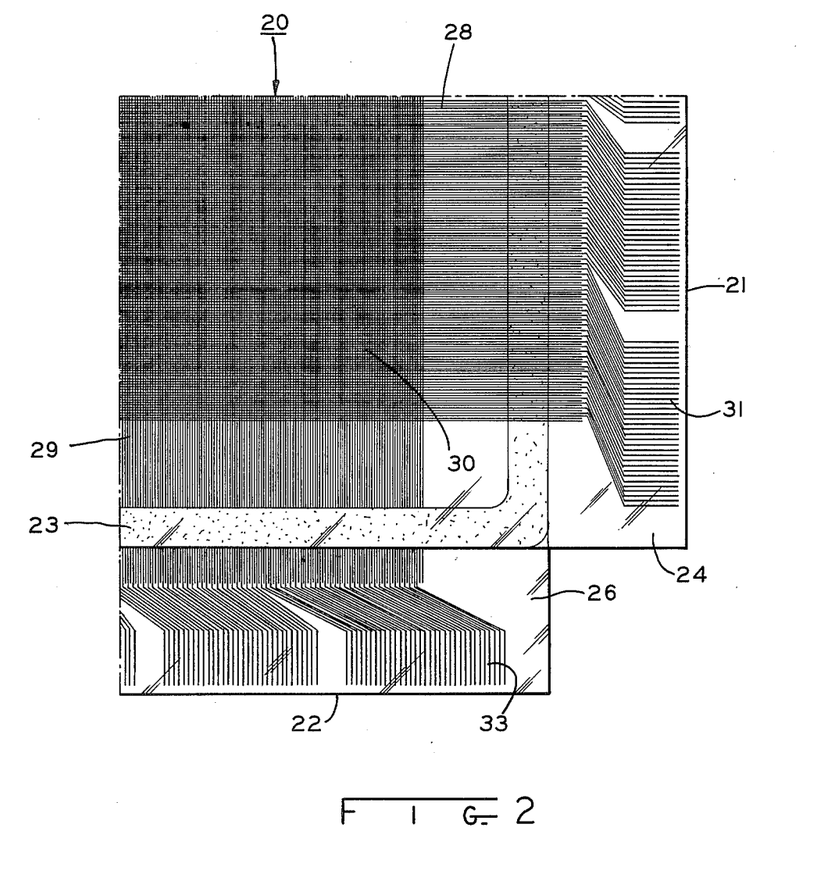
FIG. 2 is a view showing a portion of the display panel of FIG. 1.

Referring to FIG. 2, there is shown an enlarged view of a portion of the display panel 20 of FIG. 1. FIG. 2 more clearly illustrates various parts of the panel which were described above with reference to FIG. 1 and as such will herein later be useful in the understanding of the present invention.

Figure 3:
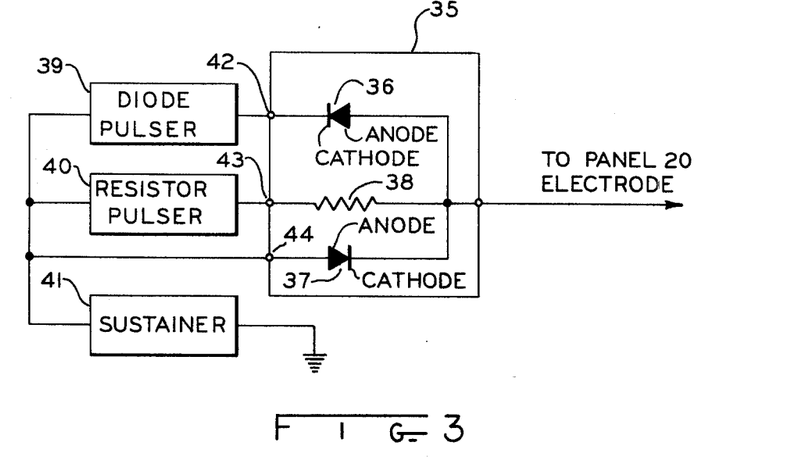
FIG. 3 is a simplified diagram of a basic diode-resistor address-selection circuit for a single display panel electrode suitable for use with the display panel of FIG. 1.

Now referring to FIG. 3 there is shown a basic logic circuit for supplying necessary operating signals to a single electrode of either the column or row electrode arrays. The logic circuit comprises a resistor-diode decoding network 35 having column or row diode 36, a column or row sustainer feed through diode 37, and a column or row resistor 38. Necessary input signals to the decoding network 35 are supplied by a diode pulser signal source 39, a resistor pulser signal source 40, and a sustainer signal source 41, each connected to the network via the respective input terminals 42, 43, and 44 as shown. The output signals from the network are supplied to the electrode of the display panel 20 via the output terminal 45. A separate resistor-diode network 35 is used for each one of the column (or row) electrodes of the display panel 20 with separate networks, identical to that shown by FIG. 3 except with the anode-cathode connections of diodes 36, 37 being reversed to that shown, for each one of the remaining row (or column) electrodes of the panel 20. As is well known in the art, the sustainer signal from source 41 for the resistor-diode network supplying signals to the electrodes of the column array is electrically 180 degrees out of phase with respect to that sustainer signal associated with the row electrodes.

The circuit shown by FIG. 3 as well as the herein later referenced and described circuit shown by FIG. 4 can be used to supply signals to the column (or row) electrodes of the display panel 20; however, by simply reversing the anode-cathode circuit connections to the diodes 36, 37 the circuit shown by FIGS. 3, 4 can be used to supply signals to the row (or column) panel electrodes. Whether the anode-cathode connections of the diodes 36, 37 as actually shown by FIGS. 3, 4 are suitable for use with either the column or the row electrodes is a function of the characteristics of the resistor-diode input signals provided by the circuitry external to the resistor-diode network 35.

Operation of the FIG. 3 logic circuit including the resistor-diode network 35 for providing operating signals to the plurality of column and row electrodes of the display panel 20 is well known in the art and is disclosed for example, in the aforementioned U.S. Pat. No. 3,727,102 issued to Johnson; therefore, additional operational description is not included herein.

In accordance with one embodiment of the present invention, a plurality of the resistor-diode networks 35 are combined on a single thick film type circuit. Referring to FIG. 4, there is shown a schematic diagram of one such thick film circuit. In FIGS. 3 and 4, items having like basic reference numerals serve substantially identical electrical functions. The thick film circuit of FIG. 4 comprises a quantity of 64 of the FIG. 3 resistor-diode decoder networks 35 arranged in four groups of networks, each group comprising 16 resistor-diode networks. In FIG. 4, each one of the plurality of diodes 36-1 to 36-64 and 37-1 to 37-64 is identical to and serves the same function as the respective diodes 36 and 37 shown in FIG. 3. Likewise each one of the plurality or resistors 38-1 to 38-64 shown in FIG. 4 is identical to and serves the same function as resistor 38 shown in FIG. 3. The output circuit of each one of the resistor-diode networks of FIG. 4 is terminated at a respective output terminal 45-1 through 45-64 of the output connector 46 for electrically interfacing with the respective electrodes of the display panel 20. Input signals are supplied to the FIG. 4 resistor-diode networks via the various terminals of connector 47. The anodes of each one of the 64 sustainer feed through diodes 37-1 through 37-64 are connected in common and to the input terminal conductor 44-1. The cathodes of each one of the 16 column or row diodes 36-1 to 36-16, 36-17 to 36-32, 36-33 to 36-48, and 36-49 to 36-64 of each one of the four groups of networks are connected in common and to a respective input terminal conductor 42-1, 42-2, 42-3, and 42-4, one for each separate group, as shown. The input of each one of the 16 separate column or row resistors 38-1 to 38-16 of the first resistor-diode group are connected in common to the input of the respective column or row resistors 38-17 to 38-32, 38-33 to 38-48, and 38-49 to 38-64 of the remaining resistor-diode groups and to the respective input connector terminals 43-1 through 43-16 as shown. Input terminals 48 and 49 are directly connected to the respective output terminals 50 and 51 by the respective thick film circuit leads 52 and 53 for providing border sustaining signals to the display panel 20 as will be herein later apparent. Display panels having border electrodes as well as the operation of such border electrodes are well known in the art and further description will not be made.

Figure 4:
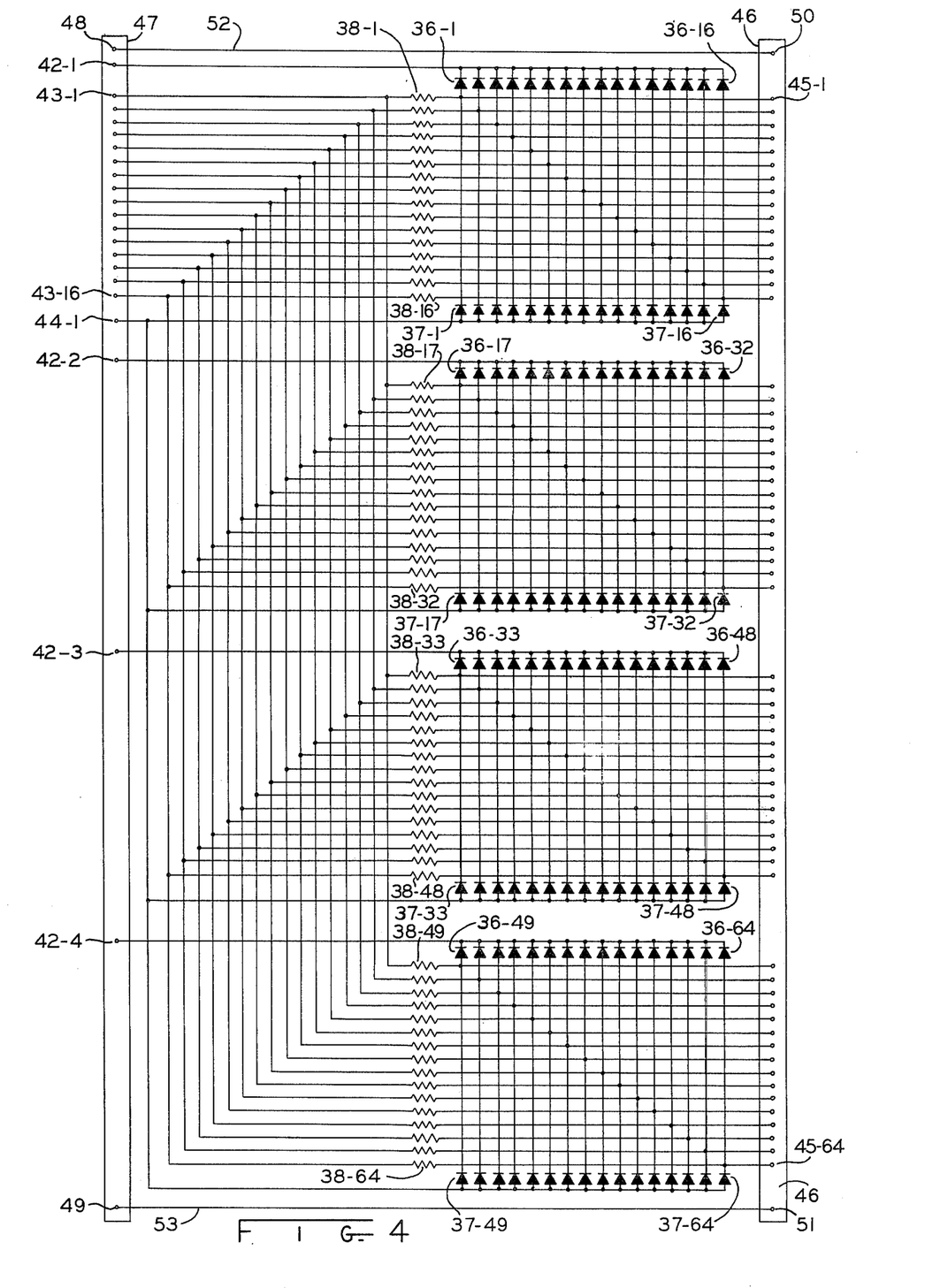
FIG. 4 is a schematic diagram of a diode-resistor matrix suitable for use in the present invention.

Since the thick film circuit shown in FIG. 4 comprises a quantity of 64 resistor-diode networks 35 for providing operating signals to 64 separate column (or row) electrodes of the display panel 20, it will be apparent that use with the previously described and referenced Digivue ® display panel will require a quantity of 8 of the FIG. 4 thick film circuits for supplying output signals to each one of the 512 electrodes comprising the column (or row) electrode arrays of the display panel. An additional quantity of 8 of the FIG. 4 thick film circuits are required for the remaining 512 electrodes comprising the row (or column) arrays of the panel. The later mentioned additional quantity having the diodes 36-1 through 36-64 and 37-1 through 37-64 connected in the FIG. 4 circuit in reverse to that shown as previously described. That is to say, the anode-cathode connections of the referenced diodes being reversed in the circuit. As an example, the cathode of diodes 37-1 through 37-64 would be all connected in common and to the connector terminal 44-1.

Figure 5:
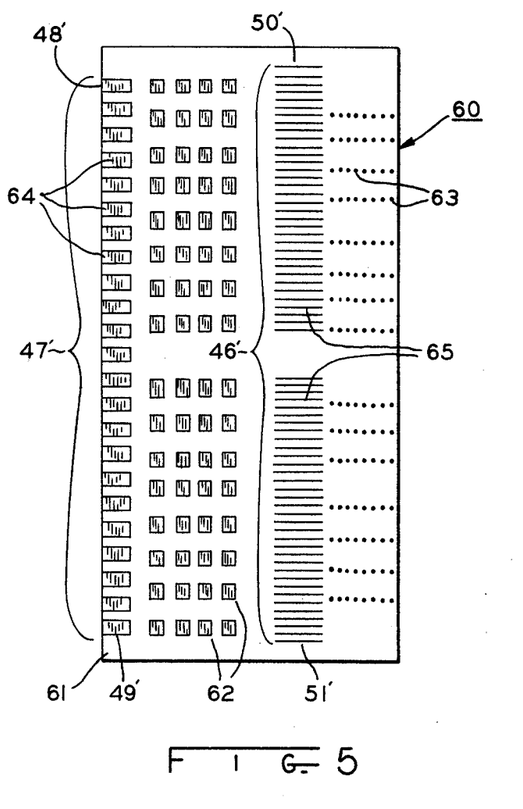
FIG. 5 is a pictorial view of a thick film circuit module of the diode-resistor matrix of FIG. 4 in accordance with the present invention.

In FIG. 5 there is shown a pictorial view of one type of thick film circuit embodiment of the previously described resistor-diode circuit of FIG. 4. In FIG. 5, items having like basic reference numerals with those previously referenced serve substantially identical functions. The FIG. 5 view showing the component and contact area side of a circuit module 60. The circuit module 60 is comprised of suitable substrate 61 such as an alumina substrate upon which the necessary circuit conductors, resistors, and contacts, as will be later described, are printed and fired using well known and conventional thick film construction techniques. The circuit module 60 comprises a quantity of 64 printed resistors 62 and a quantity of 128 diode chips 63 as in the circuit shown by FIG. 4. The diode chips 63 are equivalent to the respective diodes 36-1 to 36-64 and 37-1 to 37-64. The printed resistors 62 being equivalent to the respective resistors 38-1 to 38-64. The input signal connector 47' of the circuit module 60 comprises a quantity of 23 platinum gold electrical contact surface areas 64 each separate one corresponding to a respective one of the quantity of 23 input terminals of connector 47 shown by FIG. 4. The output signal connector 46' of the circuit module 60 comprises a quantity of 66 gold electrical contact surface areas 65 each separate one corresponding to a respective one of the terminals 45-1 to 45-64, 50, and 51 of connector 46 shown by FIG. 4. In order to simplify the view of the circuit module 60 shown by FIG. 5, the thick film intercircuit conductors are not shown; however, in the circuit module 60 described, they comprise multi-layer conductors of electrically conductive links and provide the electrical circuit connections shown in the circuit of FIG. 4. As an example, the specific contact surface area 48' of FIG. 5 is connected by a thick film conductor (not shown) to contact surface area 50'. Likewise the contact area 48' is electrically connected to contact area 51'. The remainder of the contact surfact areas 64, 65 are interconnected in accordance with the circuitry shown in FIG. 4; however, the individual sequence or arrangement with respect to one another of the remainder of the contact areas 64 need not be in the order shown by FIG. 4.

The aforementioned multi-layer construction is desirable in thick film circuit modules having a relatively large quantity of component parts in order to provide a relatively high circuit and parts density, thus minimizing the physical size of the circuit module. In one such multi-layer construction, the thick film circuit module 60 as shown by FIG. 5 was approximately 1.25 inches wide, 2.5 inches long, and 0.0625 inch thick. In this particular construction, the input signal electrical contact surface areas 64 and certain of the inter-circuit electrical conductors were printed directly upon the main substrate 61 while the remaining necessary inter-circuit electrical conductors, the output signal electrical contact surface areas 65, and the resistors 62 were printed upon a secondary substrate comprising a thin insulating or dielectric film (not shown) which overlays the main substrate 61. The diode chips 63 were mounted upon printed electrically conductive areas on the secondary substrate or dielectric film. Necessary electrical connections between the multi-layer circuitry was, of course, also provided.

As previously described with reference to FIGS. 3, 4, the circuit module 60 of FIG. 5 can be made suitable for use with the column electrodes or the row electrodes by simply reversing the polarity of the diode chips 63. This is of course easily accomplished during the construction of the thick film circuit module. Thus, the thick film circuit modules 60 when used with either the column or the row electrodes of the associated display panel 20 are identical to one another except for the above described anode-cathode connections of the diode chips 63.

The widths and center to center spacing dimensions of the contact surface areas 65 on the circuit module 60 are such as to be substantially identical to the width and spacing of the respective electrode contacts 31-34 of the display panel 20 for purposes which will later be apparent. The physical characteristics of the contact surface areas 64 will also later be apparent with reference to additional figures.

Figure 6:
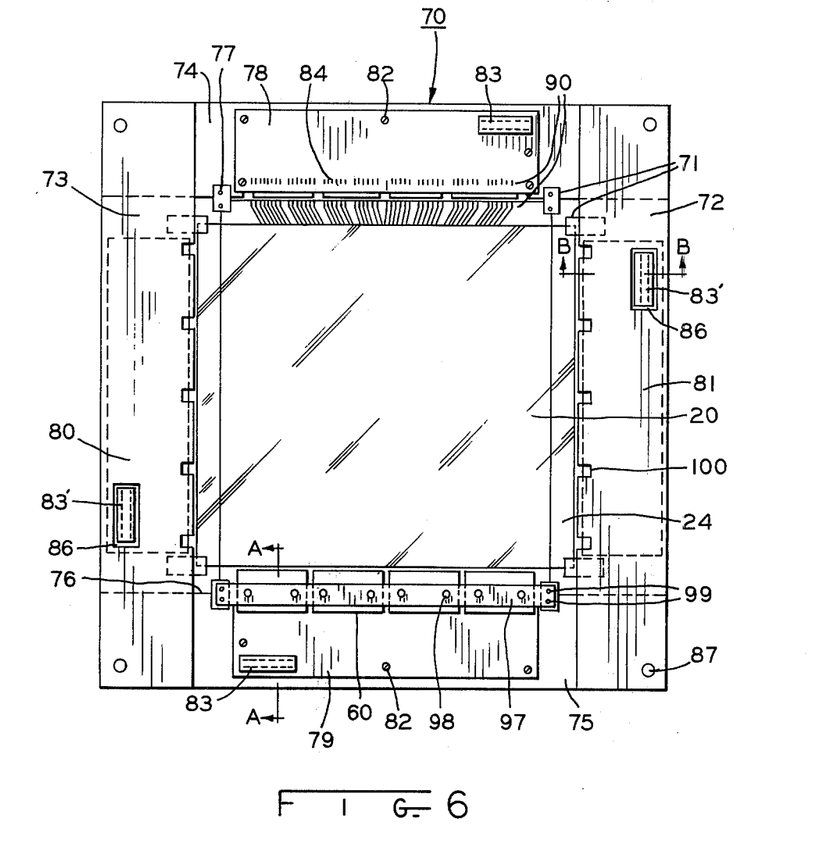
FIG. 6 is a view of one embodiment of the present invention showing a mounting apparatus for mechanically and electrically releasably interfacing a display panel and associated circuit modules.

Referring to FIG. 6, there is shown one embodiment of the present invention for releasably receiving the display panel 20 and a plurality of associated circuit modules 60. The apparatus shown in FIG. 6 comprises a mounting frame 70 within which the display panel 20 is captivated by panel clamps 71. The frame 70 comprises 4 body members 72, 73, 74, 75 which can be combined in one integral member if so desired by using for example, a single molded or machined frame structure surrounding the display panel 20. The frame 70 surrounds the outer periphery of the display panel 20 preferably with the inside edges 76 of the frame 70 closely juxtaposed with the outside edges of the display panel extensions 24, 25, 26, 27. Each one of the panel clamps 71 is suitably attached to the frame structure 70 such as with the clamp mounting screws 77. The panel clamps 71 captivate the panel 20 within the frame 70 preferably at the corners or edges of each one of the end extensions 24, 25, 26, 27 of the panel 20. Each one of the panel clamps 71 has a groove for receiving the edge of the panel within. Frame mounting holes 87 are provided for use in mounting the FIG. 6 embodiment to any desired display equipment.

Figure 7:
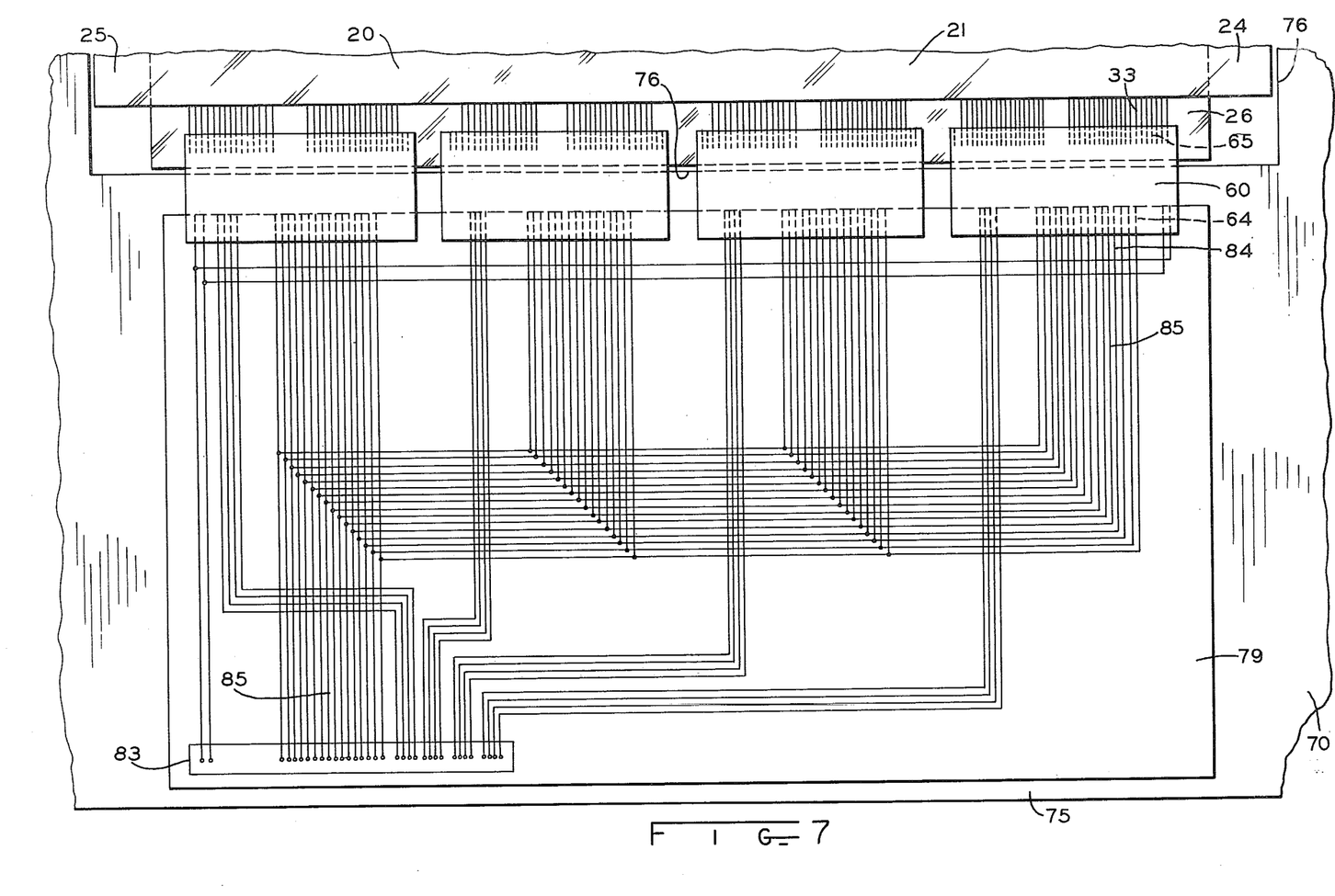
FIG. 7 is a diagram of printed circuit interconnections suitable for use in the invention embodiment of FIG. 6.

Now referring to both FIGS. 6 and 7, there is shown 4 printed circuit boards 78, 79, 80, 81 attached to the frame 70 by any suitable means such as mounting screws 82. Each one of the printed circuit boards 78, 79, 80, 81 comprises a cable connector 83 suitable for printed circuit board use, a plurality of contact surface areas 84 for mating with the contact surfaces 64 of the input connector 47' of the circuit modules 60, and printed circuit conductors 85 for providing the necessary electrical interconnections between the contact surfaces 64 of the circuit modules 60 and each respective one of the 4 printed circuit connectors 83. Input signals to the apparatus shown in FIG. 6 including the display panel 20 and circuit modules 60 are supplied by external associated circuitry by means of conventional electrical cabling and associated electrical cable connectors (not shown) for mating with each one of the printed circuit board cable connectors 83 shown in FIGS. 6 and 7. The circuit interconnecting arrangement shown in FIG. 7 is typical and it will be obvious to one skilled in the art that arrangements other than shown can be used to provide necessary electrical interconnections between the circuit modules 60 and the cable connectors 83. Since the display panel electrode contact surfaces 31, 32, 33, and 34 for the respective electrode arrays 28 and 29 are located on the inside surfaces of the glass plates 21, 22 which comprise the display panel, the two printed circuit boards 80, 81 associated with the panel electrode array 28 are attached to one side of the frame 70 while the two printed circuit boards 78, 79 associated with the panel electrode array 29 are attached to the opposite side of the frame 70. In the FIG. 6 view, the printed circuit boards 80, 81 are attached to the under side of the frame 70. The printed circuit boards 78, 79, 80, 81 can all be identical if desired; however, it is preferred that each one of the respective cable connectors 83 be accessible from one side of the frame 70 as shown in FIG. 6, thus the two printed circuit boards 80, 81 which are mounted to the underside of the frame 70 have cable connectors 83' mounted on the respective boards 80, 81 so as to allow the cable connectors 83' to protrude through respective access holes 86 in the frame 70 as shown. The printed circuitry on the printed circuit boards 78, 79, 80, 81 as well as the respective cable connectors 83 can if desired be made an integral part of the frame 70. That is, the printed circuit conductors and contact areas can be deposited directly on the frame 70 with the connectors 83 mounted directly to the frame 70. In this later configuration, the frame and/or its comprising members can be of an electrically nonconductive material suitable for printed circuitry.

In the invention embodiment shown by FIG. 6, a plurality of elastomeric connector pads 90 each one having a plurality of electrically conductive cross sectional areas or conductive bands 92 along the length dimension are affixed to the display panel end extensions 24, 25, 26, 27 and to the printed circuit boards 78, 79, 80, 81 so as to overlay the electrode connection conductors 31, 32, 33, 34 of the display panel 20 and likewise the contact surface areas 84 of each of the printed circuit boards 78, 79, 80, 81. The elastomeric, electrically conductive connector pads 90 can be secured to the display panel 20 and to the printed circuit boards or if desired as an alternate, to the circuit modules 60 by use of a suitable adhesive applied so as not to impair electrical continuity between the display panel 20, circuit modules 60, and printed circuit boards 78, 79, 80, 81 as will herein later be apparent. The configuration of one suitable form of the elastomeric pad 90 and its physical relationship to the various contact areas of the display panel 20, circuit modules 60, and printed circuit boards 78, 79, 80, 81 will become apparent herein later with relation to additional referenced FIGS. 8, 10.

Referring again to FIG. 6, the plurality of circuit modules 60 are detachable affixed to the display panel and circuit module mounting structure comprising the frame 70 and the associated printed circuit boards 78, 79, 80, 81 by means of retaining members 97. In order to simplify the FIG. 6 view only one retaining member 97 and 4 associated circuit modules 60 are shown. It should be understood however, that in the FIG. 6 embodiment, a total of 4 such members 97 are used to retain a quantity of 16 circuit modules 60 with 4 circuit modules 60 being mounted to overlay each one of the 4 end extensions 24, 25, 26, 27 of the display panel 20. The retaining members 97 can be secured to the mounting structure by means of attaching screws 98. The attaching screws 98 mating with threaded holes in the panel clamps 71. Of course other location and well known methods of affixing the retaining members 97 to the structure can be used.

In practice, the circuit modules 60 are positioned under the retaining members 97 and secured in place by manually tightening holding screws 98 against the positioned modules. This thus compresses the elastomeric connector pads 90 between the electrical contact areas of the display panel, printed circuit boards and the circuit module. Each one of the circuit modules 60 is positioned under the retaining member 97 so that the contact surface areas 64, 65 of the circuit modules face and substantially overlay the associated and respective contact surface areas 84 of the printed circuit boards 78, 79, 80, 81 and the electrode connection conductors 31, 32, 33, 34 of the mounted display panel 20 as is more clearly shown in FIG. 7. It is to be noted that the elastomeric, electrically conductive connector pad 90 is not shown in FIG. 7. The frame 70 comprises body members 72, 73, 74, 75 having cut out portions 100 to provide visibility of the electrode connection conductors on the display panel and the associated contact areas on the circuit modules to aid in visual alignment and positioning of the circuit modules 60.

Figure 8:
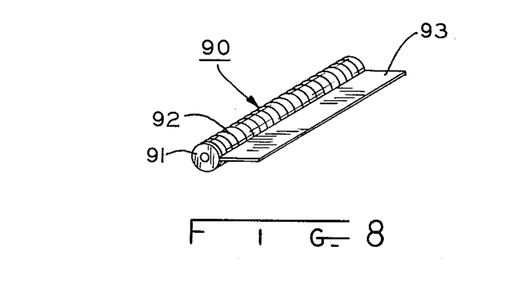
FIGS. 8 and 9 are pictorial views showing typical configurations of electrically conductive elastomeric pads suitable for use in the present invention.
Figure 9:
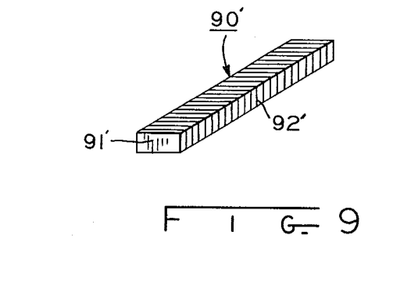
Figure 10:
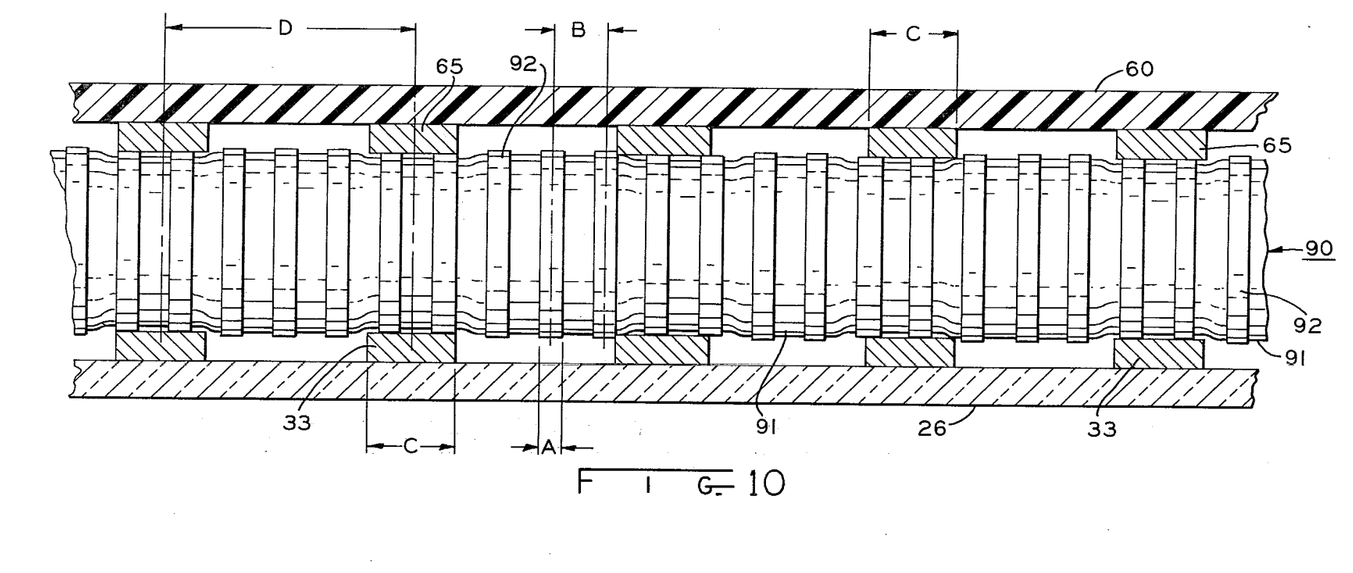
FIG. 10 is a diagram illustrating the physical relationship of mating electrical contacts and the elastomeric pads of FIGS. 7 and 8.

Referring now to FIG. 8, there is shown one form of elastomeric, electrically conductive connector pad 90 suitable for use in the several embodiments of the present invention described herein. A connector pad or strip 90 similar to that shown by FIG. 8 is manufactured by and available from AMP Incorporated, Harrisburg, Pa. The connector pad 90 shown in FIG. 8 comprises an electrically non-conductive elastomeric rod shaped body 91 around which is wrapped a plurality of individual, parallel, and equally spaced flexible electrically conductive films 92. A thin mounting extension 93 located along the length dimension of the body 91 is provided to facilitate mounting of the connector pad 90. In one type of elastomeric connector pad 90 available from AMP Incorporated, each one of the conductive bands 92, as illustrated in FIG. 10, has a nominal width dimension "A" of 0.003 inch and a center to center band spacing dimension "B" of 0.007 inch. The diameter of the elastomeric body 91 is selected to provide a compressed dimension, within that specified by the manufacturer. The elastomeric pad shown by FIG. 9 is another configuration suitable for use in the herein described embodiments of the present invention. As is evident, the connector pad 90' shown in FIG. 9 has a rectangular cross-sectional body 91'. The conductive portions 92' can be bands of conductive film as previously described or can be conductive cross-sectional portions of the body 91'.

Figure 11:
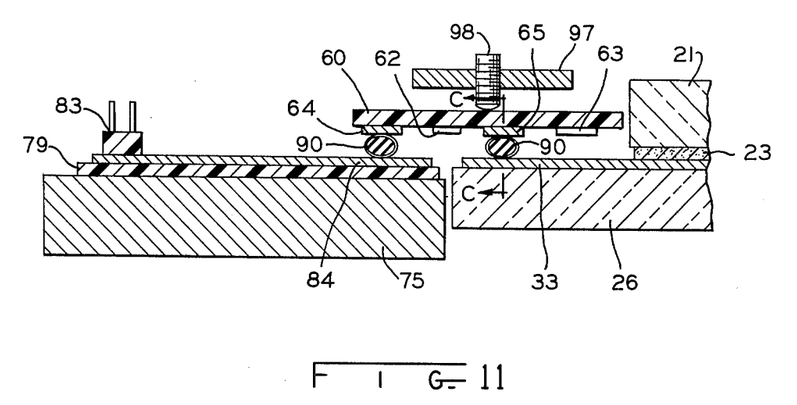
FIGS. 11 and 12 are cross-sectional views of respective sections A—A and B—B shown in FIG. 6.
Figure 12:
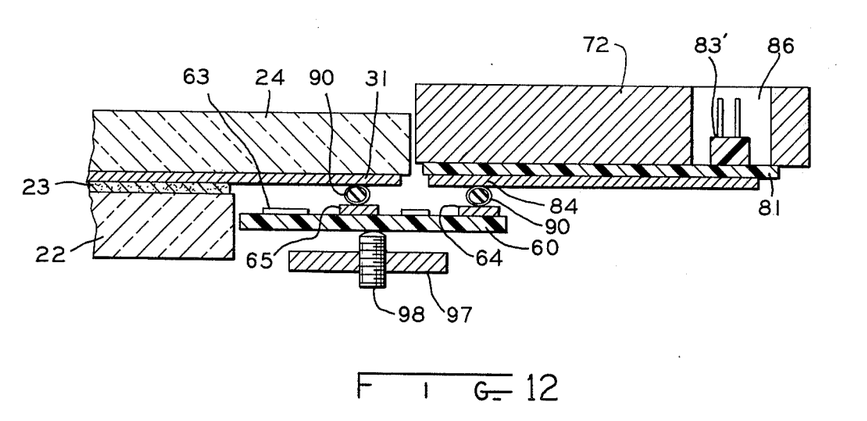

FIGS. 11 and 12 are cross sectional views through the respective sections "A—A" and "B—B" shown in FIG. 6 and illustrate the relationship of the mounting frame 70 with the display panel 20 and circuit modules 60 mounted thereto. FIGS. 11 and 12 also more clearly illustrate the previously described relationship of the electrical contact areas on the printed circuit boards and on the display panel with the circuit module including the elastomeric connector strip therebetween. Although FIG. 11 is a cross sectional view through the lower frame member 79 as shown in FIG. 6, it is also typical of a similar view through the upper frame member 74. Likewise, FIG. 12 being a view through the right hand frame member 72 shown in FIG. 6, it is also typical of a similar view through the frame member 73 shown on the left hand side of the FIG. 6 view.

Referring again to FIG. 10 there is shown a partial sectional view taken through the section "C—C" shown in FIG. 11 showing the relationship of the contact surface areas 65 on the circuit module 60, the elastomeric conductor pad 90, and the corresponding mating electrode connection conductors 33 on the display panel 20. For clarity, the connector pad shown in FIG. 10 is not cross sectionalized. Although the view of FIG. 10 is shown in an enlarged scale compared to an actual embodiment, it illustrates a typical relative relationship of the dimensions involved in a preferred embodiment of the invention. The elastomeric connector pad 90 represents, for example, the previously described connector pad manufactured by AMP Incorporated; the conductor band nominal width dimension "A" representing 0.003 inch and the center to center spacing dimension "B" representing 0.007 inch. Likewise, the electrode connection conductors 33 of the display panel 20 and the center to center spacing of these conductors as shown in FIG. 10 are dimensionally representative of those embodied on the previously described Digivue ® Model 512-60, Owen-Illinois display panel. The nominal width dimension "C" of the panel conductors 33 shown in FIG. 10 thus representing 0.012 inch and the center to center nominal spacing dimension "D" representing 0.033 inch. As shown in FIG. 10, it is preferred that the contact areas 65 on the circuit module 60 have widths and center to center spacings substantially identical to the previously described conductors 33 on the display panel 20. It is apparent from a study of FIG. 10, that considerable variations can occur in the various described nominal dimensions as well as the variations in the overlay alignment of the contacts 65 on the circuit module 60 with the mating conductors 33 on the display panel 20 without disrupting electrical continuity of the connections therebetween. In addition it is now apparent that compression of the elastomeric, conductive pad 90 resulting from the mounted circuit modules 60 and display panel 20 within the mounting frame 70 as previously described, results in positive electrical contact pressure regardless of surface irregularities in the various described parts including irregularities in the glass substrate surface of the display panel 20, the substrate of the circuit modules 20, and/or the printed circuit boards 78, 79, 80, 81. Thus the invention embodiment of FIG. 6 provides the objectives previously described.

Figure 13:
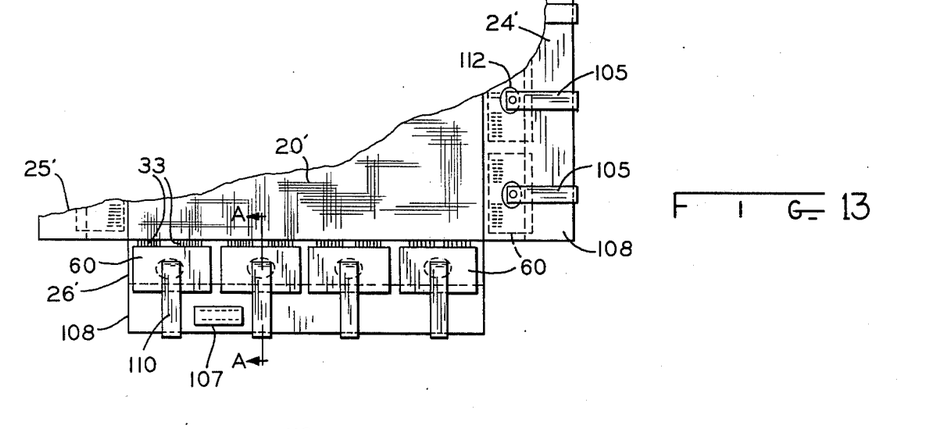
FIG. 13 is a partial view of another embodiment of the present invention showing apparatus for releasably interfacing a display panel and associated circuit modules.

Referring now to FIG. 13, there is shown a partial view of another embodiment of the present invention. In FIG. 13 as well as FIGS. 14 and 15, basic reference numerals, like those previously described, denote like or similar structure and/or function. In the invention embodiment of FIG. 13, each one of the circuit modules 60 is releasably attached directly to the display panel 20' by a clamping means 105. Since FIG. 13 shows only a partial view of the embodiment the following description makes specific reference only to that structure shown in FIG. 13; however, it should be understood that the complete embodiment comprises 16 circuit modules 60, having 4 modules 60 clamped on each one of 4 separate end extensions of the display panel 20' much the same as previously described with reference to the embodiment shown in FIG. 6.

The end extensions 24' and 26' shown in FIG. 13 are similar to the previously described end extensions 24 and 26 shown in FIGS. 1, 2, and 6; however, all 4 of the end extensions of the display panel 20' including the end extensions 24' and 26' shown in FIG. 13, have an extended length dimension for providing thereon as an integral part of the extension suitable printed circuitry 106 including contact areas 104 for mating with the contact surface areas 64 of the circuit modules 60, and cable connectors 107. The printed circuitry 106 provides the necessary electrical interconnections between the circuit modules 60 and the cable connector 107, much the same as provided by the previously described printed circuitry 85 shown in FIG. 7. The module contact areas 104, printed circuitry 106, and cable connectors 107 shown in FIGS. 13, 14, 15 perform a function similar to that performed by the contact surface areas 84, printed circuitry 85, and cable connectors 83 previously described with reference to FIGS. 6 and 7.

Again referring to FIG. 13, a printed circuit board 108 is comprised of a substrate 109 upon which the necessary printed circuitry 106 is deposited or printed. The printed circuit board 108 also comprises the cable connector 107 mounted thereon. A printed circuit board 108 is attached to each one of the 4 end extensions of the display panel 20' including the end extensions 24' and 26' as shown. The printed circuit boards 108 can be attached to the end extensions 24' and 26' by any well known mechanical means or by the use of an epoxy type cement. As an alternate, the printed circuitry 106 including the contact areas 104 can be deposited directly upon the glass of the end extensions 24' and 26' of the display panel 20' using the panel glass as a substrate in lieu of the previously referenced separate substrate 109. The cable connectors 107 can be mounted directly upon the glass of the end extensions 24' and 26' by the use of, for example, an epoxy cement.

Figure 14:
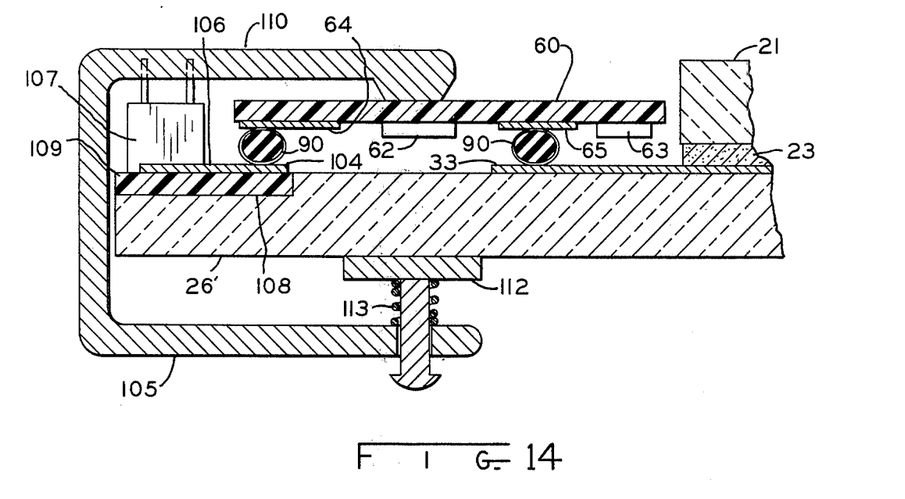
FIG. 14 is a cross-sectional view of section A—A shown in FIG. 12.

FIG. 14 is a cross sectional view along section "A—" of FIG. 13. FIG. 14 shows in more detail the relationship of one of the several clamping means 105, printed circuit boards 108, circuit modules 60, and the display panel 20'. The circuit modules 60 are removably attached to the display panel 20' by the clamping means 105. The clamping means 105, as shown in FIGS. 13 and 14, is comprised of a clamp body 110 and pad 112. The pad 112 is spring loaded against the panel extension 26' by a spring 113 which provides a compressional clamping force whereby the clamped circuit module 60 is retained in an installed and aligned position on the display panel 20'. It should be understood that the elastomeric conductor pad 90 performs the same function as previously described in relation to FIGS. 6 and 10 whereby there is provided electrical continuity between the contact areas 63 and 64 of the circuit module 60 and the respective mating electrical conductors 31, 32, 33, 34 on the display panel 20' and the contact areas 104 of the printed circuit board 108.

Figure 15:
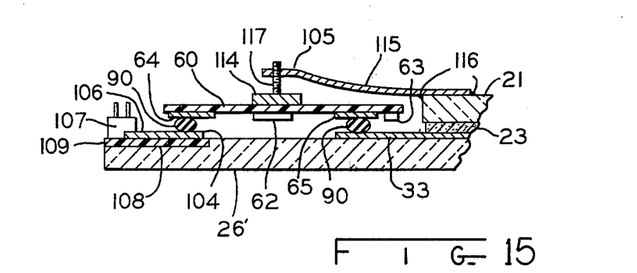
FIG. 15 is a cross-sectional view similar to FIG. 13 showing another arrangement of clamping circuit modules to the display panel.

Referring now to FIG. 15, there is shown a cross sectional view similar to that of FIG. 14 of an alternate type of clamping means 105. The clamping means 105 shown in FIG. 15 is attached to and made a part of the display panel 20'. The clamping means 105 shown in FIG. 15 comprises a pad 114 and a resiliant member 115. The resiliant member 115 is attached in place to the display panel 20' by a suitable adhesive 116 such as, for example, silicone or epoxy. The clamping means 105 in FIG. 15 and the clamping means 105 of FIG. 14, both provide a downward force against the installed and aligned circuit module 60 thereby holding the circuit module 60 in place as previously described. The pad 114 in FIG. 15 can, if desired, be attached to the resiliant member 115 by means comprising a threaded post 117 fitted in a mating threaded hole in the resiliant member 115 whereby there is provided the capability of an adjustment of the compressional force of the pad 114 against the circuit module 60.

Although the present invention has been described in relation to several particular embodiments by way of example, it should be understood that such descriptions are illustrative of the invention and its use and are not intended to be restrictive thereof. As an example, display panels 20 other than the type described can be used and the drive circuitry for the display panel 20 need not be limited to that described in relation to FIG. 3. The circuit modules 60 for example, need not be limited to the resistor diode circuitry shown by FIG. 4 and can contain any desired type of circuitry either associated with or essential to the operation of the display panel 20. Although, as previously stated, multi-layer circuits are desirable in order to reduce the physical size of the circuit module 60, the invention is not limited to multi-layer circuit modules or circuit modules having circuitry on one side of the substrate only. Likewise, reference herein to printed electrical conductors, resistors, or the like is meant to include any of the well known types or methods of applying electrical conductors and/or parts to a substrate such as for example, using screening, deposition, photo processes, or pre-cut conductive materials. In addition, the circuit modules 60 need not be limited to thick film type circuits but can comprise thin film, integrated circuits, or circuits using discrete circuit components such as transistors, or the circuit modules 60 can comprise a combination of such type circuits. The quantity of circuit modules 60 need not be limited to the number used in the embodiments described but can be of a lessor or greater number. As an example, the resistor diode circuitry contained in each one of the four groups of circuit modules shown in FIGS. 6 and 13, can be combined on a single circuit module if so desired, thus each embodiment would comprise only one circuit module 60 on each one of the four sides of the display panel 20 in lieu of the four circuit modules shown. In addition, the circuit modules 60 need not be distributed equally about each one of the four sides of the display panel 20. When the present invention is used in combination with a display panel 20 having non-alternating row and column electrode terminal contacts on only two of the four panel extensions, as previously described, it is preferred that the circuit modules 60 be distributed about the two sides of the display panel 20 having the electrode terminal contacts, when for example, the circuit modules contain the resistor diode type circuitry shown by FIG. 4. Circuit modules 60 containing other type circuits can be used in addition to the resistor diode circuitry and these circuit modules can be distributed equally or unequally about the four sides of the display panel 20 as may be desired. The cable connectors 38 and/or 107 as shown in FIGS. 6 and 13 need not be limited to the quantity of four as shown and can be of a lessor or greater number. In addition, these connectors need not be limited to the type shown in the figures; for example, the printed circuit boards 108 shown in FIGS. 13, 14, and 15 can be extended in length past and over the edge of the display panel extension 24' and 26' for accepting an edge type printed circuit board connector with the connector mating with printed contact areas printed upon the printed circuit board 108. The circuit means can comprise a lesser or greater number of printed circuit boards 78, 79, 80, 81, and 108 than shown in FIGS. 6 and 13 and can provide interconnecting circuitry other than that shown by FIG. 7 as well as terminal contacts for mating with circuit modules containing circuitry not requiring direct electrical connections to the electrode terminal contacts of the display panel 20. The configuration of the clamping means 105 need not be limited to that shown in FIGS. 13 and 15 and the circuit module retaining means in the FIG. 6 embodiment for releasably attaching the circuit modules 60 to the frame 70 need not be limited to that shown and described. Although the embodiments of the present invention shown by both FIGS. 6 and 13 have the circuit modules 60 each clamped individually, more than one circuit module can be clamped simultaneously, thus the number of circuit module clamps can be of a lesser or greater quantity than the number of circuit modules used. In addition, the electrically conductive and compressable elastomeric pads need not be limited to the connector pads 90 as shown in FIGS. 8 and 9 and, for example, can be comprised of a single or a plurality of staggered rows of small, individual dots of resiliant or elastomeric and electrically conductive material deposited upon the contact area surfaces of the circuit module 60 or the contact areas surfaces of the printed circuit boards 78-81, 108 and display panel 20.

Numerous other changes, modifications, and adaptations of the disclosed invention can be made by those having ordinary skill in art without departing from the spirit of the invention. It is intended that such changes, modifications, and adaptations of the invention will be within the scope of the following appended claims.

What is claimed is:

1. An improved interface apparatus for use with a relatively flat discharge display panel of the type having row and column electrodes for forming discrete discharge cites thereon and having an outer periphery and extensions on at least two sides of the periphery, the extensions having input terminal contacts connected to the row and column electrodes for connection to circuitry essential to the operation of the display panel, the improved apparatus comprising:
   circuit means having input terminals and output terminal contacts and having electrical conductors for providing electrical inter-connections between predetermined ones of the input terminals and predetermined ones of the output terminal contacts;
   a plurality of circuit modules for providing at least a part of the display panel operating circuitry and having input and output terminal contacts connected to the circuitry, the input and output terminal contacts of the circuit modules being adapted to releasably overlay and mate with the output terminal contacts and the input terminal contacts of the respective circuit means and the display panel;
   module clamping means for releasably receiving and holding said circuit modules in positions about the extensions of the display panel for providing said mating of said circuit module contacts with said contacts of the display panel and circuit means whereby electrical interface connections are provided between the input terminals of said circuit means and the plurality of the releasably received circuit modules and between the plurality of the modules and the display panel; and
   a plurality of electrically conductive and compressible elastomeric pads interposed between at least the output terminal contacts of said circuit means and the input terminal contacts of the received circuit modules.

2. The apparatus of claim 1 further comprising a plurality of electrically conductive and compressible elastomeric pads interposed between the output terminal contacts of said modules and said display panel.

3. The apparatus of claim 1 wherein said circuit modules further comprise one or more substrates and the input and output terminal contacts of said circuit modules comprise electrical conductors printed upon said one or more substrates.

4. The apparatus of claim 3 further comprising a frame member for releasably receiving and holding the display panel within.

5. The apparatus of claim 4 wherein said circuit means further comprises at least two printed circuit boards positionally affixed to said frame member adjacent to the extensions of the received display panel.

6. The apparatus of claim 3 wherein said conductive and elastomeric pads are affixed to said substrate of said circuit modules.

7. The apparatus of claim 3 wherein said circuit means is affixed to the extensions of the display panel.

8. An apparatus for releasably receiving a relatively flat display panel and a plurality of circuit modules associated therewith and for providing electrical interface connections therebetween, the display panel having sides and outside edges and having input terminal contacts for connection to display panel operating circuitry, the circuit modules having at least a part of said panel operating circuitry and having output terminal contacts and input terminal contacts, the apparatus comprising:
   a frame member means for receiving the display panel and having sides and inside edges adapted to juxtapositionally surround the outside edges of the received display panel;
   a panel clamping means for releasably holding the received display panel within said frame member;
   a module clamping means for releasably holding the plurality of received circuit modules in positions mutually overlaying the received display panel and said frame member for providing electrical continuity between predetermined ones of the output terminal contacts of the plurality of received circuit modules and predetermined ones of the input terminal contacts of the received display panel;
   a circuit means having output terminal contacts and input terminals for providing electrical interconnections between the output terminal contacts and the input terminals, the output terminal contacts of said circuit means positioned on said frame member for providing electrical continuity between predetermined ones of the output terminal contacts of the circuit means and predetermined ones of the input terminal contacts of the received circuit modules whereby electrical interface connections are made between the input terminals of said circuit means and the plurality of received circuit modules and between the plurality of the modules and the received display panel; and
   a plurality of electrically conductive and compressible elastomeric pads interposed between at least the output terminal contacts of said circuit means and the input terminal contacts of the received circuit modules.

9. The apparatus of claim 8 further comprising a plurality of electrically conductive and compressible elastomeric pads interposed between the output terminal contacts of the received circuit modules and the display panel.

10. The apparatus of claim 8, wherein said circuit means comprises at least one printed circuit board.

11. The apparatus of claim 10 wherein the input terminals of said circuit means comprises at least one multi-contact connector.

12. The apparatus of claim 8 wherein the module clamping means comprises means for clamping different groups of one or more of the plurality of received circuit modules about each one of the sides of the display panel.

13. The apparatus of claim 12 wherein the circuit means comprises at least one individual printed circuit means for each one of said groups, said individual circuit means comprising at least one multi-contact connector.

* * * * *